United States Patent [19]

Saeki et al.

[11] 4,404,663

[45] Sep. 13, 1983

[54] INTEGRATED CIRCUIT

[75] Inventors: Yukihiro Saeki, Yokohama; Fuminari Tanaka, Kawasaki; Yasoji Suzuki, Yokosuka, all of Japan

[73] Assignee: Tokyo Shibaura Denki Kabushiki Kaisha, Japan

[21] Appl. No.: 234,438

[22] Filed: Feb. 13, 1981

[30] Foreign Application Priority Data

Mar. 6, 1980 [JP] Japan .................................. 55-27309

[51] Int. Cl.$^3$ ............................................. G11C 7/00
[52] U.S. Cl. .................................. 365/206; 365/231
[58] Field of Search ............... 365/174, 189, 191, 193, 365/195, 198, 206, 231, 233

[56] References Cited

U.S. PATENT DOCUMENTS 4,031,523  6/1977  Horsten .............................. 365/206

Primary Examiner—Joseph A. Popek
Attorney, Agent, or Firm—Finnegan, Henderson, Farabow, Garrett & Dunner

[57] ABSTRACT

An integrated circuit wherein a gate circuit is provided on a bus line mounted on a semiconductor substrate. The gate circuit is used to separate an unused circuit block from other circuit blocks which are connected to a bus line through an input-output circuit for high speed data transmission, thereby reducing a parasitic capacity which might be imparted to the bus line by the separated circuit block. The input-output circuit is formed of a clocked inverter. The gate circuit is formed of a C-MOS transmission gate. The input-output circuit and gate circuit are so connected that where the gate of the inverter is opened, then the C-MOS transmission gate is closed; and where the gate of the inverter is closed, then the C-MOS transmission gate is opened.

4 Claims, 5 Drawing Figures

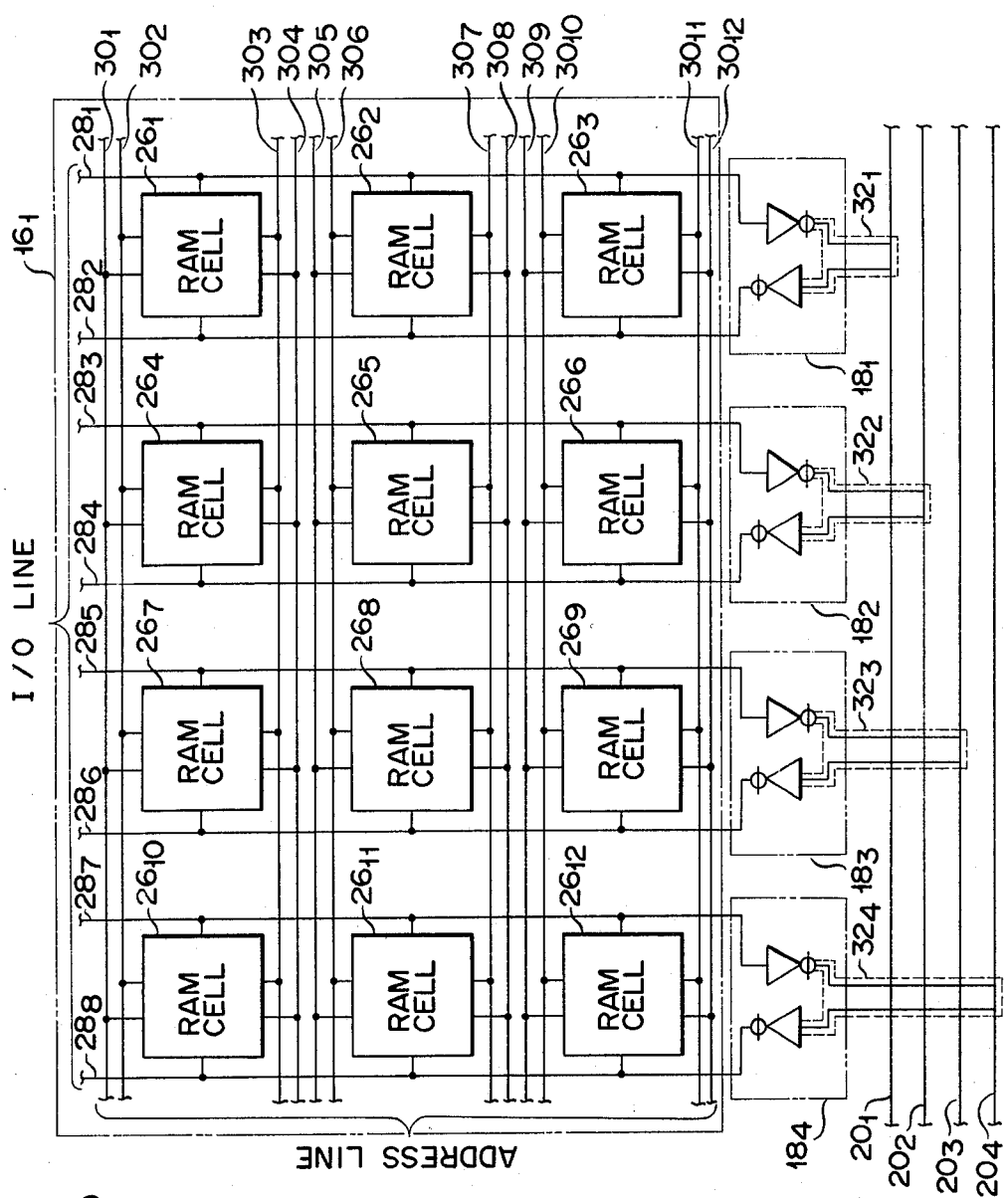
F I G. 3

INTEGRATED CIRCUIT

BACKGROUND OF THE INVENTION

This invention relates to an integrated circuit for processing signals at high speed by decreasing a parasitic capacity in a common bus line.

A bus line system is generally adopted for a highly integrated circuit to effectively reduce an area occupied by wiring. With the bus line system, the peripheral circuits are grouped into blocks. These circuit blocks are connected to a given number of common bus lines through the corresponding input-output circuits (hereinafter referred to as "I/O circuits"). Data are transmitted between the respective peripheral circuits through the common bus lines. Therefore, as compared with a system using independent lines for the respective circuit blocks, the bus line system can noticeably decrease the number of lines, thereby simplifying arrangement of lines and preventing an increase in their number.

With the above-mentioned bus line system, the bus lines and diffused regions constituting I/O circuits are connected by diffused lines. Consequently, a difficulty arises in that the junction capacity possessed by the diffused regions tends to be parasitically accumulated in the bus line.

FIG. 1 illustrates the manner in which a parasitic capacity is accumulated in a bus line used with a conventional bus line system. FIG. 1 shows in enlargement part of a junction of a diffused line and bus line used in the prior art integrated circuit provided with four common bus lines. The common bus lines $10_1$ to $10_4$ are formed of aluminum and are arranged in parallel at a prescribed interval. The common bus lines $10_1$ to $10_4$ are set on diffused lines $12_1$ to $12_4$ at right angles. Reference numerals $13_1$ to $13_4$ denote the regions in which the diffused lines $12_1$ to $12_4$ and bus lines $10_1$ to $10_4$ contact each other. As a result, the capacities of the diffused lines $12_1$ to $12_4$ and the capacities $14_1$ to $14_4$ of diffused I/O regions (not shown) become parasitic on the common bus lines $10_1$ to $10_4$.

Where an integrated circuit is enlarged in scale and consequently circuit blocks increase in number, then I/O circuits connected to common bus lines also have a large number. Therefore, a parasitic capacity in the common bus line increases. The increased parasitic capacity causes the common bus line to have a large time constant ($\tau = CR$). Accordingly, transmission of a signal through such common bus line is prominently delayed. This event presents difficulties in processing data at high speed by a one chip LSI circuit.

For resolution of the above-mentioned drawback, a method has been proposed which is intended to elevate the conductivity of diffused I/O lines. However, this method results in an increase in a total area of diffused lines, and consequently a decline in an integration density per unit area. Therefore, said method has proved practically unsuitable for high integration.

SUMMARY OF THE INVENTION

It is accordingly an object of this invention to provide an integrated circuit which minimizes a parasitic capacity in a common bus line.

Another object of the invention is to provide an integrated circuit which can accelerate data transmission.

Still another object of the invention is to provide an integrated circuit which enables an unused circuit block to be easily removed.

To attain the above-mentioned objects, the invention provides an integrated circuit which comprises:
 a plurality of circuit blocks formed on a semiconductor substrate;
 I/O circuits which are formed on the semiconductor substrate in connection to the circuit blocks to carry out data transmission between the circuit blocks;
 bus lines which are connected to the I/O circuits for data transmission between the circuit blocks; and
 a gate circuit which is connected to the bus lines to separate a circuit block unrelated to data transmission from other circuit blocks carrying out high speed data transmission.

With an integrated circuit embodying this invention which is arranged as described above, a circuit block unrelated to data transmission is separated from other circuit blocks carrying out high speed data transmission, thereby decreasing parasitic capacity to an extent corresponding to the separation of said unrelated circuit block, and effecting high speed data transmission between circuit blocks.

With the integrated circuit of the invention, an I/O circuit is formed of a clocked inverter, and a gate circuit is formed of a C-MOS transmission gate circuit. Where the gate of the clocked inverter is opened, then the C-MOS transmission gate circuit is closed by mutually complementary control signals. Conversely where the C-MOS transmission gate circuit is opened, then the clocked inverter is closed by said mutually complementary control signals. Therefore, an unused circuit block can be easily separated from a bus line.

BRIEF DESCRIPTION OF THE DRAWINGS

The objects of the invention will be seen by reference to the description taken in connection with the accompanying drawings, in which:

FIG. 3 schematically indicates an arrangement of a circuit block whose memory circuit is formed of a random access memory (RAM);

DETAILED DESCRIPTION OF THE PREFERRED EMBODIMENTS

Figure 1:
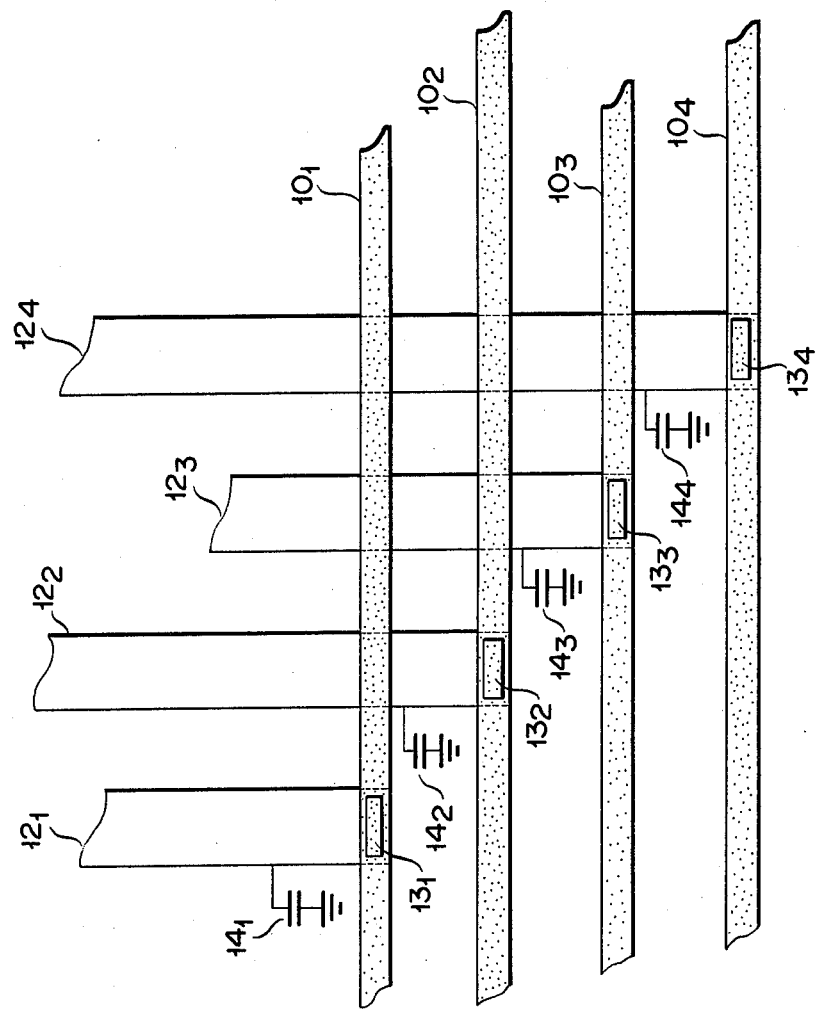
FIG. 1 is a partial enlarged view of a prior art integrated circuit, showing connection between diffused lines and bus lines.
Figure 2:
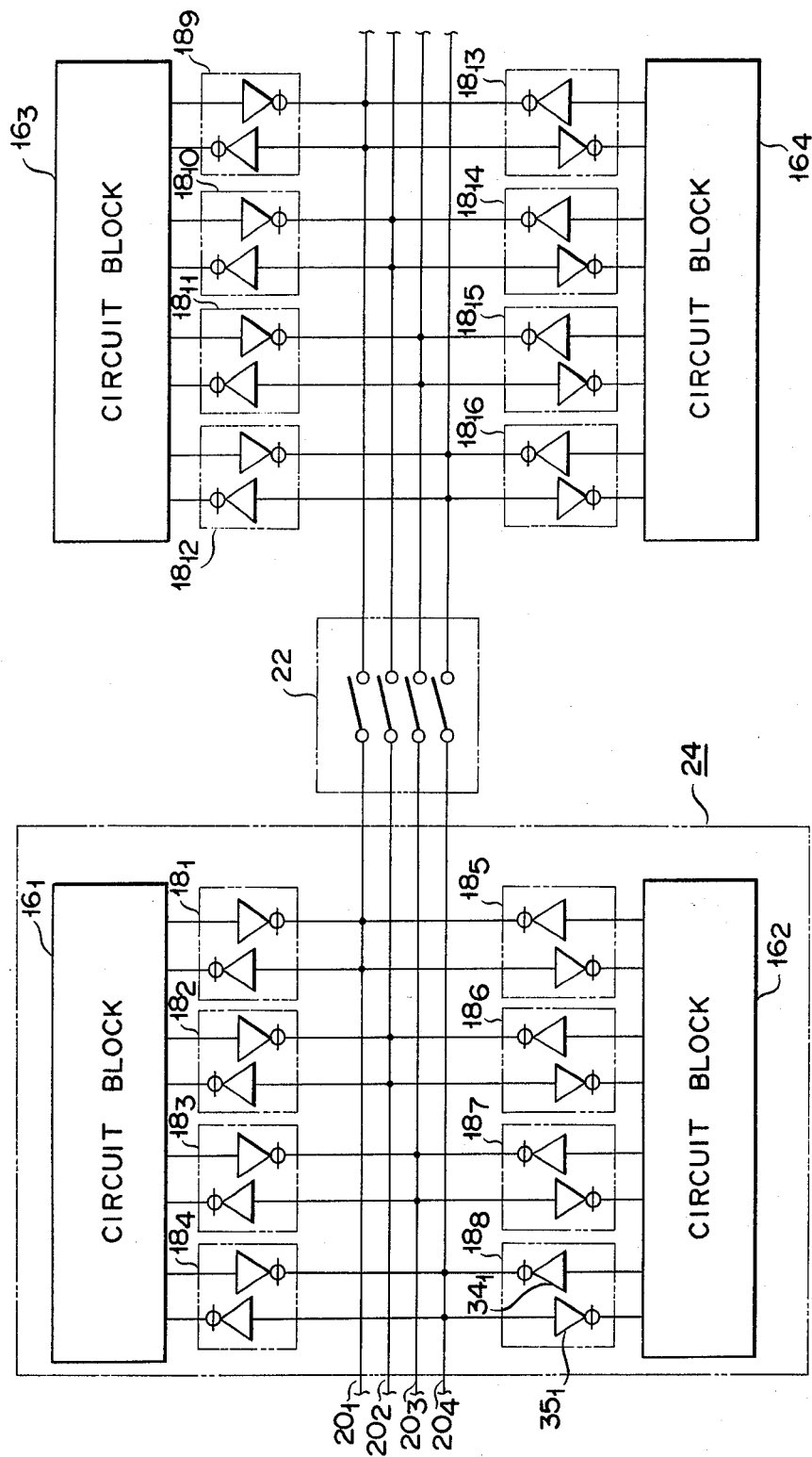
FIG. 2 shows an arrangement of an integrated circuit embodying this invention which is provided with 4-bit bus lines.

This invention is applicable to an integrated circuit provided with bus lines of more than 1 bit. Description is now given with respect to FIGS. 2 to 5 of an integrated circuit embodying the invention which is provided with 4-bit bus lines. FIG. 2 is a schematic block diagram showing an arrangement of the above-mentioned 4-bit bus line type integrated circuit. Each of circuit blocks $16_1$ to $16_4$ formed on a semiconductor substrate constitutes, for example, a memory circuit shown in FIG. 3. The circuit blocks $16_1$ to $16_4$ may constitute arithmetic operation circuits or any other logic circuits or a combustion thereof.

Referring to FIG. 2, I/O circuits $18_1$ to $18_4$ are connected to the circuit block $16_1$; I/O circuits $18_5$ to $18_8$ to the circuit block $16_2$; I/O circuits $18_9$ to $18_{12}$ to the circuit block $16_3$; and I/O circuits $18_{13}$ to $18_{16}$ to the circuit block $16_4$. These I/O circuits $18_1$ to $18_{16}$ carry out data supply to the block circuits $16_1$ to $16_4$ and data withdrawal therefrom.

Four bus lines $20_1$ to $20_4$ are connected to the I/O circuits $18_1$ to $18_{16}$, and used in common as passages of data transmission between the circuit blocks $16_1$ to $16_4$.

A gate circuit 22 is provided for the bus lines $20_1$ to $20_4$. When opened, the gate circuit 22 separates circuit blocks $16_3$, $16_4$ from a unit 24 which is formed of the circuit blocks $16_1$, $16_2$ and I/O circuits $18_1$ to $18_8$, thereby ensuring high speed data transmission. When closed, the gate circuit 22 connects said unit 24 to the other blocks $16_3$, $16_4$.

Either or both of the circuit blocks $16_3$, $16_4$ when carrying out data transmission with respect to the unit 24 have a large parasitic capacity. It is therefore preferred in the unit 24 to position the circuit blocks $16_1$, $16_2$ undertaking high speed data transmission facing each other as closely as possible (as shown in FIG. 2) with the bus lines $20_1$ to $20_4$ interposed therebetween.

FIG. 3 shows a schematic arrangement of the circuit block $16_1$ constituting a RAM unit. The I/O circuit $18_1$ is connected through I/O lines $28_1$, $28_2$ to a group of RAM cells $26_1$ to $26_3$ connected in parallel with respect to said I/O lines $28_1$, $28_2$. The I/O circuit $18_2$ is connected through I/O lines $28_3$, $28_4$ to a group of RAM cells $26_4$ to $26_6$ connected in parallel with respect to said I/O lines $28_3$, $28_4$. The I/O circuit $18_3$ is connected through I/O lines $28_5$, $28_6$ to a group of RAM cells $26_7$ to $26_9$ connected in parallel with respect to said I/O lines $28_5$, $28_6$. The I/O circuit $18_4$ is connected through I/O lines $28_7$, $28_8$ to a group of RAM cells $26_{10}$ to $26_{12}$ connected in parallel with respect to said I/O lines $28_7$, $28_8$. Data is supplied to and withdrawn from the RAM cells $26_1$ to $26_{12}$ through the I/O lines $28_1$ to $28_8$. The RAM cells $26_1$ to $26_{12}$ are connected to address lines $30_1$ to $30_{12}$. Four RAM cells constituting any of three groups $(26_1-26_4-26_7-26_{10})$, $(26_2-26_5-26_8-26_{11})$, $(26_3-26_6-26_9-26_{12})$ are selected by address signals supplied through the corresponding group of address lines chosen from among address lines $30_1$ to $30_{12}$ (for example, through the address lines $30_1$, $30_2$, $30_3$, $30_4$ for the group of RAM cells $26_1-26_4-26_7-26_{10}$). Data stored in the selected RAM cells are sent forth to any of the common bus lines $20_1$ to $20_4$ and/or data conducted through any of said common bus lines $20_1$ to $20_4$ are stored in the selected RAM cells.

Diffused lines $32_1$ to $32_4$ are formed as indicated in broken lines in FIG. 3 for connection between the I/O circuits $18_1$ to $18_4$ and bus lines $20_1$ to $20_4$. Therefore, junction capacities possessed by the diffused lines $32_1$ to $32_4$ and diffused regions constituting I/O circuits $18_1$ to $18_4$ are parasitically accumulated in the bus lines $20_1$ to $20_4$. The circuit blocks $16_1$ to $16_4$ impart a parasitic capacity, large or small, to the common bus lines $20_1$ to $20_4$, and consequently may be regarded as capacitive loads. These loads enlarge the time constant ($\tau = CR$) of the respective bus lines $20_1$ to $20_4$, and slow down the speed of data transmission therethrough. Actually, a circuit block having an exceedingly large parasitic capacity is sometimes connected to a bus line. This event undesirably gives rise to a decline in the designed high speed of data transmission carried out by the circuit block.

With an integrated circuit embodying this invention, a gate circuit is provided, as described later, for a bus line. This arrangement enables a circuit block imparting a particularly large parasitic capacity to a bus line to be separated from other circuit blocks when they carry out high speed data transmission, thereby ensuring accelerated data transmission between said circuit blocks.

Figure 4:
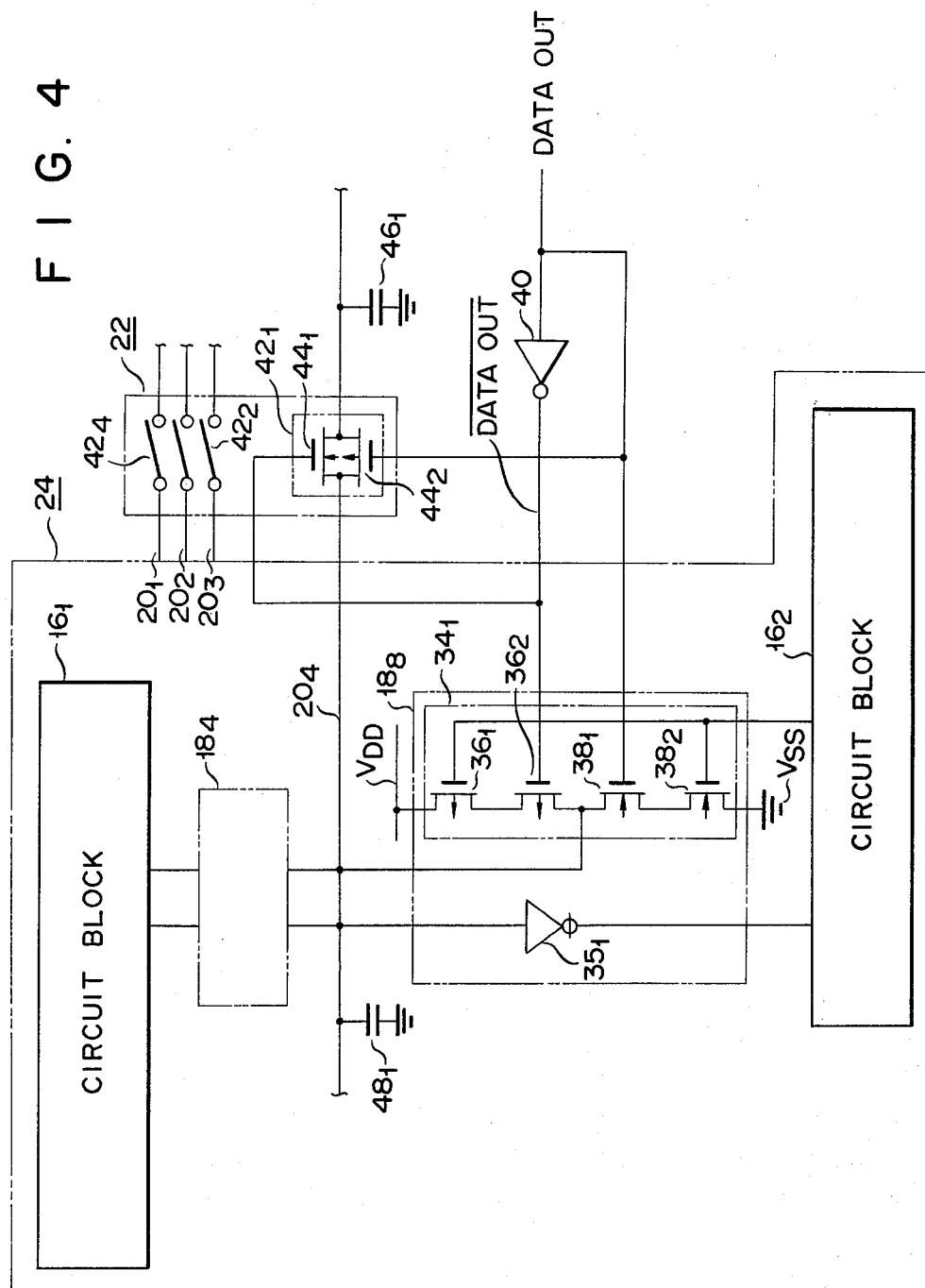
FIG. 4 sets forth with respect to 1-bit data an arrangement of an I/O circuit included in the integrated circuit of FIG. 2 and a gate circuit.

FIG. 4 shows the connection between the I/O circuit $18_8$ of FIG. 2 and the gate circuit 22 with respect to a 1-bit bus line $20_4$. The I/O circuit $18_8$ is formed between the circuit blocks $16_2$ and bus line $20_4$. The gate circuit 22 is provided for the bus lines $20_1$ to $20_4$ set between the unit 24 and the circuit blocks $16_3$, $16_4$ (not shown in FIG. 4).

The output section of the I/O circuit $18_8$ is formed of a clocked inverter $34_1$. This inverter $34_1$ is formed by arranging between a first power source $V_{DD}$ and a second power source $V_{SS}$ first and second P channel transistors $36_1$, $36_2$ and third and fourth N channel transistors $38_1$, $38_2$ in such a manner that the sources and drains of the respective transistors are sequentially connected in series. A data signal sent forth from the circuit block $16_2$ is supplied to the first and fourth transistors $36_1$, $38_2$. The source of the second transistor $36_2$ and the drain of the third transistor $38_1$ is connected to the bus line $20_4$. An inverted data signal is issued from the junction to the bus line $20_4$. A $\overline{\text{DATA OUT}}$ signal is supplied to the gate of the third transistor $38_1$. The output terminal of an inverter 40 is connected to the gate of the second transistor $36_2$ to supply a $\overline{\text{DATA OUT}}$ signal to the gate of said second transistor $36_2$.

The clocked inverter $35_1$ constituting an input section of the I/O circuit $18_8$ has the same arrangement as the clocked inverter $34_1$.

The gate circuit 22 is formed of C-MOS transmission gates $42_1$ to $42_4$ having the same arrangement. Therefore, description is only given of a C-MOS transmission gate $42_1$. This C-MOS transmission gate $42_1$ is formed by mutually connecting the sources of an N channel transmission gate $44_1$ and P channel transmission gate $44_2$ and also mutually connecting their drains. The source terminal of the C-MOS transmission gate $42_1$ is connected to that portion a common bus line $20_4$ which is connected to the unit 24. The drain terminal of said C-MOS transmission gate $42_1$ is connected to that portion of the common bus line $20_4$, which is connected to the circuit blocks $16_3$, $16_4$.

The gate of a second transistor $36_2$ included in the clocked inverter $34_1$ is connected to the gate of an N channel transistor $44_1$ included in the C-MOS transmission gate $42_1$. The gate of a third transistor $38_1$ included in the clocked inverter $34_1$ is connected to the gate of a P channel transistor $44_2$ included in the C-MOS transmission gate $42_1$.

Description is now given of the operation of an I/O circuit shown in FIG. 4. A $\overline{\text{DATA OUT}}$ clock signal having a logic level "1" is supplid from a control circuit (not shown) to the gate of the third transistor $38_1$ included in the clocked inverter $34_1$. A DATA OUT clock signal having a logic level "0" is delivered through an inverter 40 to the gate of a second transistor $36_2$ included in the inverter $34_1$. As a result, the gate voltages of the second and third transistors $36_2$, $38_1$ grow higher than the respective threshold voltages, thereby rendering said second and third transistors $36_2$, $38_1$ conducting. On the other hand, the gate voltages of the N and P channel transistors $44_1$, $44_2$ included in the C·MOS transmission gate $42_1$ fall below the respective threshold voltages, thereby rendering said N and P channel transistors $44_1$, $44_2$ nonconducting. Therefore, even though data is sent forth from the circuit block $16_2$ to the bus line $20_4$ through the clocked inverter $34_1$, data is not transmitted through said C·MOS transmission gate $42_1$.

Conversely, where the DATA OUT clock signal has a logic level "0" and the DATA OUT-clock signal has a logic level "1", then the gate voltages of the second and third transistors $36_2$, $38_1$ become lower than the respective threshold voltages, rendering said transistors $36_2$, $38_1$ nonconducting. On the other hand, the gate voltages of the N and P channel transistors included in the C·MOS transmission gate $42_1$ grow higher than the respective threshold voltages, thereby rendering said N and P channel transistors $44_1$, $44_2$ conducting. In other words, where the clocked inverter $34_1$ is actuated, then the C·MOS transmission gate $42_1$ remains inoperative. Conversely, where the C·MOS transmission gate $42_1$ is actuated, the inverter $34_1$ is thrown out of operation. Therefore, data transmission from the circuit block $16_2$ to the circuit block $16_1$ can be accelerated by rendering the clocked inverter $34_1$ conducting and the transmission gate $42_1$ nonconducting. Moreover, the aforementioned circuit arrangement eliminates the necessity of producing any particular signal to actuate the C·MOS transmission gate $42_1$.

Therefore, the bus line $20_4$ can be easily shut off by the I/O circuit of FIG. 4 having a simple arrangement, thereby readily eliminating a parasitic capacity imparted to the bus line $20_4$ by the I/O circuits $18_{12}$, $18_{16}$. Consequently data transmission between the circuit blocks $16_1$, $16_2$ is saved from the harmful affect of the parasitic capacity $46_1$. Therefore, a circuit dimension can be reduced by taking into account only the adverse effect of the parasitic capacity $48_1$ imparted to the bus line $20_4$ by the I/O circuits $18_4$, $18_8$, thereby accelerating data transmission. In other words, this invention exerts a prominent effect, where it is necessary to separate that portion of, for example, a bus line $20_4$ where a particularly large parasitic capacity is accumulated.

Figure 5:
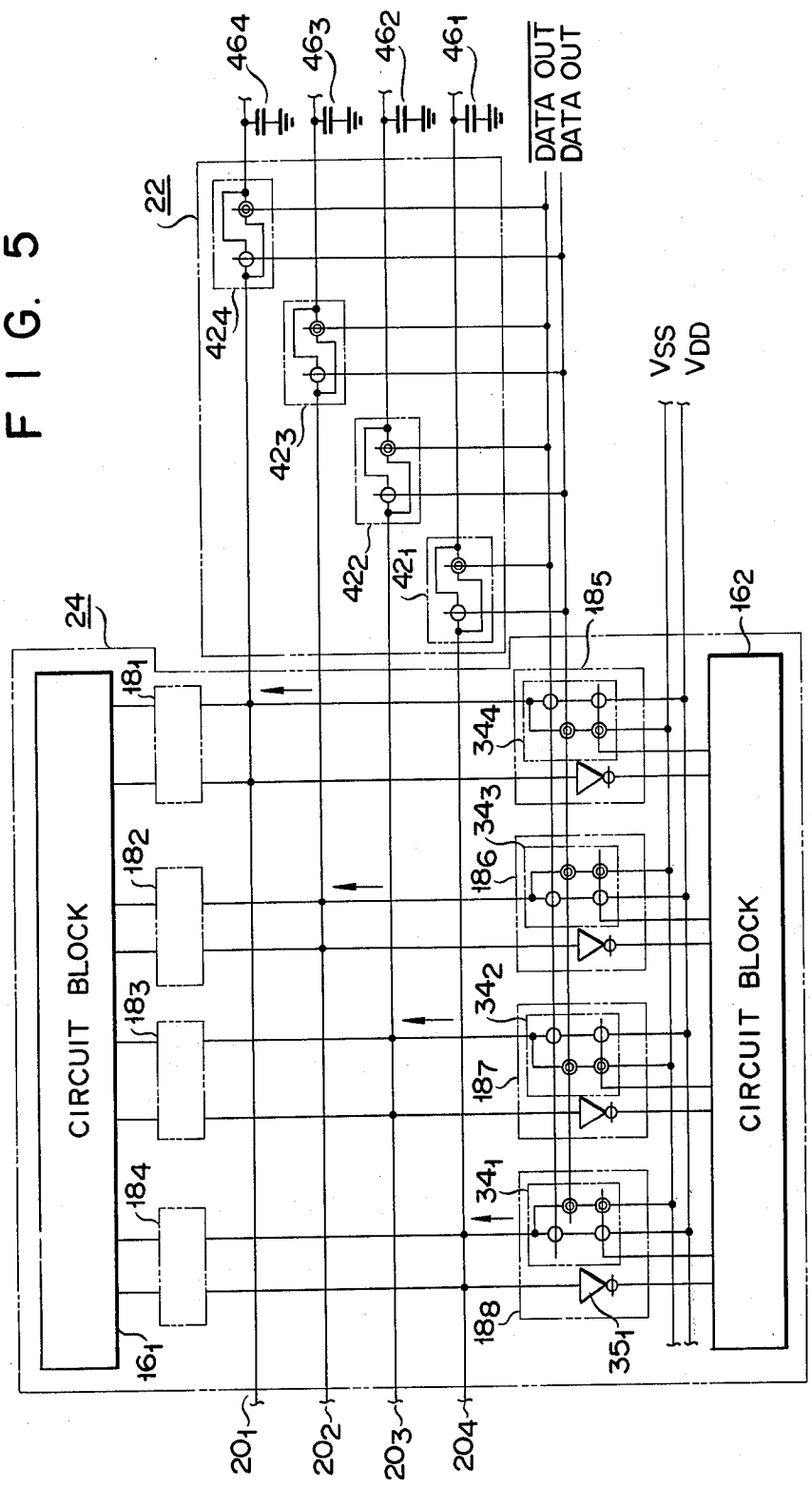
FIG. 5 shows with respect to 4-bit data an arrangement of an I/O circuit included in the integrated circuit of FIG. 2 and a gate circuit.

FIG. 5 shows connection between the gate circuit 22 and the output terminals of the 4-bit I/O circuits $18_5$ to $18_8$ for controlling an input to and an output from the circuit block $16_2$ shown in FIG. 2. Description was given with reference to FIG. 4 of the operation of the clocked inverter $18_8$ and C·MOS transmission gate $42_1$ with respect to a 1-bit bus line $20_4$. The operation of said clocked inverter $18_8$ and C·MOS transmission gate $42_1$ is fundamentally the same as in FIG. 4 with respect to 4-bit bus lines $20_1$ to $20_4$, too. The respective elements of FIG. 5 are connected in the same way as in FIG. 4. Referring to FIG. 5, a single circle denotes a P channel transistor, and a double circle shown an N channel transistor.

Where the clocked inverters $34_1$ to $34_4$ are supplied with a DATA OUT clock signal having a logic level "1" and a DATA OUT clock signal having a logic level "0", then the gates of said clocked inverters $34_1$ to $34_4$ are opened. As a result, data is sent forth from the circuit block $16_2$ to the 4-bit bus lines $20_1$ to $20_4$ as indicated in arrows in FIG. 5. At this time, the C·MOS transmission gates $42_1$ to $42_4$ of the gate circuit 22 remain closed, thereby separating unused circuit blocks $16_3$, $16_4$. Therefore, data is not transmitted through the gates $42_1$ to $42_4$. The reason for this is that, as described with respect to FIG. 4, the clocked inverters $34_1$ to $34_4$ and C·MOS transmission gates $42_1$ to $42_4$ are connected together in complementary relationship; where, therefore, the inverters $34_1$ to $34_4$ are rendered conducting, then the transmission gates $42_1$ to $42_4$ are closed; and conversely where the inverters $34_1$ to $34_4$ are thrown out of operation, then the transmission gates $42_1$ to $42_4$ are opened.

Where, 4-bit data is supplied from the circuit block $16_2$ to the bus lines $20_1$ to $20_4$ through the clocked inverters $34_1$ to $34_4$, then it is possible to completely eliminate parasitic capacities $46_1$ to $46_4$ accumulated in the bus lines $20_1$ to $20_4$ separated by the C·MOS transmission gates $42_1$ to $42_4$. As a result, data transmission governed by a time constant $\tau = CR$ defined by the circuit constants of the bus lines $20_1$ to $20_4$ can be accelerated to an extent corresponding to the parasitic capacities $46_1$ to $46_4$ eliminated by the C·MOS transmission gates $42_1$ to $42_4$.

This invention is not limited to the abovementioned embodiment in which four bus lines were used. But the invention is obviously applicable to an integrated circuit provided with one or more bus lines. Further, with the foregoing embodiment, a single C·MOS transmission gate is set in one bus line. However, more than one C·MOS transmission gates may be provided in one bus line. Further with the foregoing embodiment, the conduction and nonconduction of the C·MOS transmission gates $42_1$ to $42_4$ constituting the gate circuit 22 were carried out by control signals supplied to the clocked inverters $34_1$ to $34_4$. However, it is possible to use control signals supplied to the clocked inverters of other circuit blocks, depending on the arrangement of output inverters formed on the semiconductor substrates of clocked inverters connected to the transmission gates $42_1$ to $42_4$. Obviously, this invention may be applied in various modifications without departing from the scope and object of the invention.

What we claim is:

1. An integrated circuit which comprises:
   first, second and third circuit blocks for storing data;
   a bus line;
   first, second and third input-output means with said first input-output means connected between said bus line and said first circuit block, said second input-output means connected between said bus line and said second circuit block, and said third input-output means connected between said bus line and said third input-output block, for supplying data received from said bus line to said respective circuit blocks and for withdrawing data from said respective circuit blocks to said bus line, the connections of said first and second input-output means to said bus line and the connection of said third input-output means to said bus line being spaced from each other along said bus line; and
   gate circuit means coupled to said bus line between said connections of said first and second input-output means and the connection of said third input-output means to said bus line, for separating said first and second circuit blocks from said third circuit block upon transmission of data over said bus line between said first and second circuit blocks.

2. The integrated circuit according to claim 1 wherein said input-output means each comprises a clocked inverter having an N channel transistor and a P channel transistor.

3. The integrated circuit according to claim 2 wherein said gate circuit means comprises a C·MOS transmission gate circuit.

4. The integrated circuit according to claim 3 wherein said C·MOS transmission gate circuit comprises a P channel transmission gate and an N channel transmission gate connected in parallel to one another, source to source and drain to drain, with the control electrode of said P channel transmission gate connected to the control electrode of said N channel transistor included in said clocked inverter and the control electrode of said N channel transmission connected to the control electrode of said P channel transistor included in said clock inverter, and means for supplying mutually complementary control signals to said control electrodes of said P channel and N channel transmission gates, said two gates of said C·MOS transmission gate circuit being closed when said N and P channel transistors of said clock inverter are nonconducting and said two gates of said C·MOS transmission gate circuit being opened when said N and P channel transistors of said inverter are conducting.

* * * * *